United States Patent
Sigmon et al.

[11] Patent Number: 6,157,253
[45] Date of Patent: Dec. 5, 2000

[54] HIGH EFFICIENCY POWER AMPLIFIER CIRCUIT WITH WIDE DYNAMIC BACKOFF RANGE

[75] Inventors: Bernard Eugene Sigmon, Gilbert; Ronald Gene Myers, Scottsdale, both of Ariz.

[73] Assignee: Motorola, Inc., Schaumburg, Ill.

[21] Appl. No.: 09/389,903

[22] Filed: Sep. 3, 1999

[51] Int. Cl.[7] ...................................................... H03F 3/38
[52] U.S. Cl. ........................................ 330/10; 330/124 R
[58] Field of Search ................................ 330/10, 124 R, 330/127, 136, 297, 51

[56] References Cited

U.S. PATENT DOCUMENTS

| | | | |
|---|---|---|---|
| 4,831,334 | 5/1989 | Hudspeth et al. | 330/10 |
| 5,757,229 | 5/1998 | Mitzlaff | 330/124 R |
| 5,886,572 | 3/1999 | Myers et al. | 330/10 |
| 5,936,464 | 8/1999 | Grondahl | 330/10 |
| 5,942,938 | 8/1999 | Myers et al. | 330/10 |
| 6,064,269 | 8/1999 | Ruppel et al. | 330/297 |

Primary Examiner—Robert Pascal
Assistant Examiner—Henry Choe
Attorney, Agent, or Firm—Jeff D. Limon; Frank J. Bogacz

[57] ABSTRACT

A radio frequency signal (FIG. 2, 205) is sampled and the sample is conveyed to a video detector (220). The detected envelope amplitude is sent to an envelope tracking circuit (280), a comparator (230), and an envelope tracking and gate biasing circuit (240). Based on the instantaneous value of the envelope amplitude, the comparator (230) selects one of the available supply voltages (340) via switch drivers (270). The selected one of the available supply voltages (340) is adjusted by the envelope tracking circuit (280) and the resulting voltage output (282) is supplied to the drains of the power amplifiers (390), thus enabling operation near saturation. As the instantaneous value of the envelope amplitude increases, the comparator (230) selects higher supply voltages (340) which increases the voltage conveyed to the power amplifiers (390), thereby increasing their power output. In order to maintain constant gain performance, the envelope tracking and gate biasing circuit (240) modifies the gate bias inversely with the changes the drain voltage.

20 Claims, 4 Drawing Sheets

HIGH EFFICIENCY POWER AMPLIFIER CIRCUIT WITH WIDE DYNAMIC BACKOFF RANGE

FIELD OF THE INVENTION

The invention relates in general to power amplifiers and, more particularly, to high efficiency power amplifier circuits.

BACKGROUND OF THE INVENTION

As modern wireless communication systems continue to increase in popularity, a particular communications node must provide services to an ever-increasing group of subscribers. For example, in a wireless terrestrial cellular communications system, a cellular base station must maintain a capability to provide connectivity with an increasing number of users within communications range of the station. In a satellite cellular communications system, the satellite communications node must be capable of transmitting messages to, and receiving messages from, a large number of terrestrial based subscribers.

When a communications node, such as a cellular base station or a communications satellite, transmits to a group of subscribers, a single power amplifier circuit can be used to transmit the signals to the subscribers. Thus, the power amplifier circuit used to perform this transmission can be optimized for performance at a relatively high power output. However, when the power amplifier circuit is transmitting to only a single subscriber or to a small group of subscribers, the efficiency of the power amplifier circuit begins to degrade as the amplifier power output decreases. The capability for a power amplifier circuit to maintain efficiency over a wide range of power output levels is referred to as dynamic backoff range. Loss of power amplifier efficiency under dynamic backoff conditions can be especially problematic when the communications node is an orbiting satellite, where power resources are scarce and comparatively expensive.

Therefore, it is highly desirable to employ a power amplifier circuit that incorporates high efficiency techniques which can provide efficient operation over a wide dynamic backoff range. A power amplifier circuit which provides these features can reduce the primary power requirements of a satellite communications node, thereby reducing the cost of service to subscribers. this, in turn, can result in increased availability of satellite communication services to subscribers.

BRIEF DESCRIPTION OF THE DRAWINGS

The invention is pointed out with particularity in the appended claims. However, a more complete understanding of the present invention may be derived by referring to the detailed description and claims when considered in connection with the figures, wherein like reference numbers refer to similar items throughout the figures.

DESCRIPTION OF THE PREFERRED EMBODIMENTS

A high efficiency power amplifier circuit with wide dynamic backoff range allows a satellite or terrestrial-based communications node to provide efficient power amplification over a variety of output power levels. Thus, satellite and terrestrial-based communications nodes can be built using smaller primary power sources without sacrificing usable radio frequency output power. Additionally, as a larger percentage of usable power can be transmitted through a communications antenna, the associated communications system can function properly using smaller and less-complex cooling provisions. This can reduce the cost of wireless satellite or terrestrial-based communications, making these services more affordable to subscribers.

Figure 1:
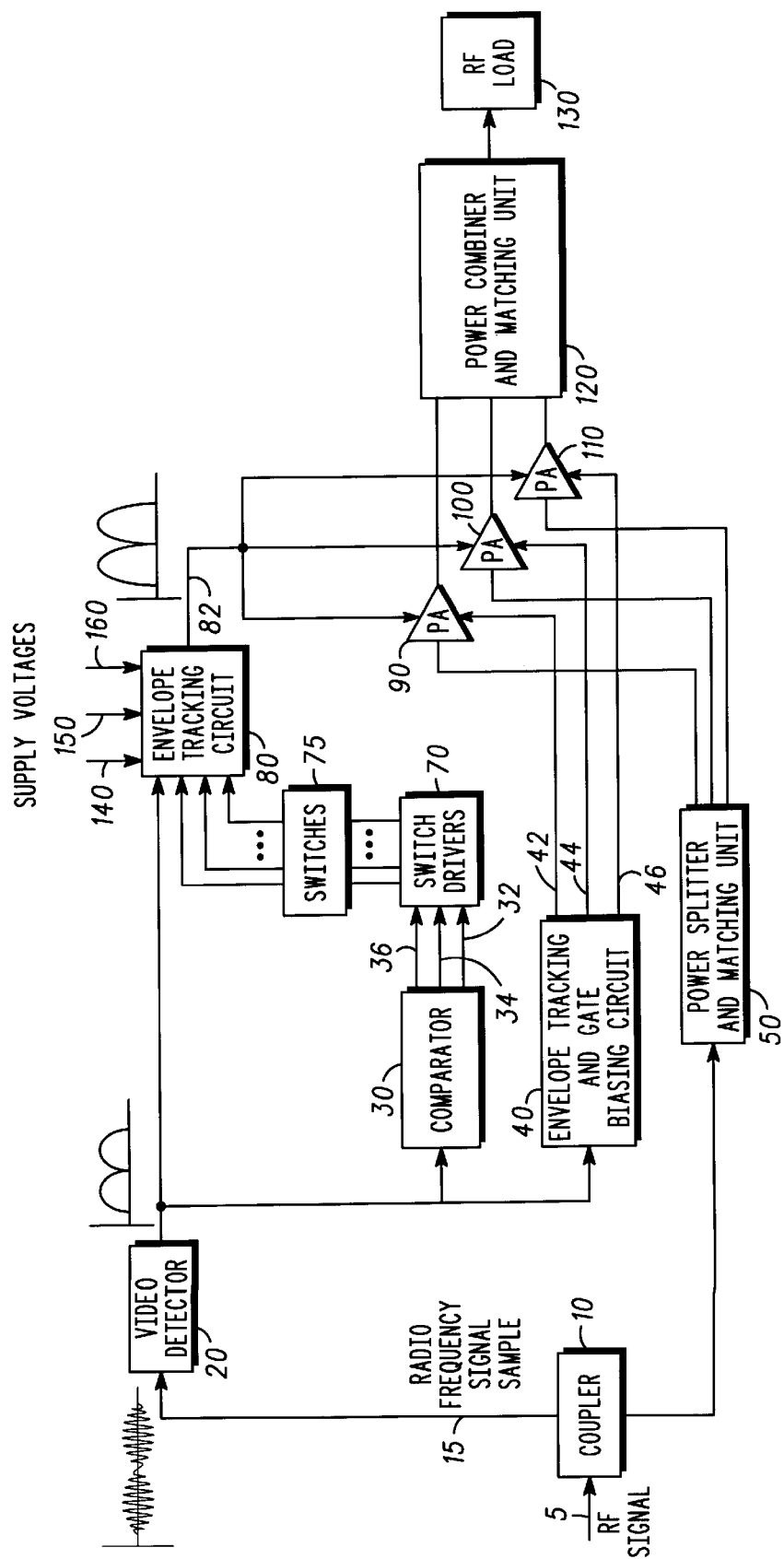
FIG. 1 is a block diagram of a three stage envelope tracking circuit supplying voltage to a three transistor high efficiency power amplifier circuit with wide dynamic backoff range in accordance with a preferred embodiment of the invention.

FIG. 1 is a block diagram of a three stage envelope tracking circuit supplying voltage to a three transistor high efficiency power amplifier circuit with wide dynamic backoff range in accordance with a preferred embodiment of the invention. In FIG. 1, radio frequency signal 5 is incident on coupler 10. Radio frequency signal 5 may be a composite signal which includes one or more communication signals intended for a corresponding number of subscribers. Thus, in a terrestrial-based wireless communication system, radio frequency signal 5 can include communication signals for each subscriber currently engaged in a telephone call using a particular cellular base station. Similarly, in a satellite communication system, radio frequency signal 5 can include communication signals for each subscriber using a particular satellite communications node.

Preferably, coupler 10 presents a matched load to radio frequency signal 5, thereby minimizing any energy reflected back to the source of the signal. Thus, coupler 10 can include lumped or distributed circuit elements which provide appropriate matching to the transmission line which conveys radio frequency signal 5 to the power amplifier circuit of FIG. 1. Coupler 10 also functions to couple radio frequency signal sample 15 to video detector 20. Desirably, radio frequency signal sample 15 is a reduced-power version of radio frequency signal 5 which includes only a small portion of the energy present in radio frequency signal 5.

Coupler 10 conveys the bulk of the energy included in radio frequency signal 5 to power splitter and matching unit 50. In a preferred embodiment, power splitter and matching unit 50 incorporates suitable lumped or distributed elements which match the input impedances presented by power amplifiers 90, 100, and 110, to a standard impedance value, such as 50 or 75 Ohms. Additionally, power splitter and matching unit 50 apportions the signal from coupler 10 in a manner which allows substantially equal coupling of energy to each of power amplifiers 90, 100, and 110.

Video detector 20 receives radio frequency signal sample 15 and determines the envelope amplitude of the signal. Video detector 20 can include a diode and other passive linear and/or nonlinear components which function to filter the carrier frequency from the radio frequency signal sample and present its envelope amplitude at an output. Desirably the envelope amplitude of radio frequency signal sample 15 from video detector 20 is conveyed to comparator 30, envelope tracking and gate biasing circuit 40, and to envelope tracking circuit 80.

As previously mentioned, comparator 30 accepts an envelope amplitude from video detector 20. In a preferred embodiment, comparator 30 evaluates the envelope amplitude from video detector 20 as a function of time. When a portion of the envelope amplitude from video detector 20 is of minimum amplitude, such as when the envelope amplitude is increasing from a near zero value, comparator 30 activates a particular output, such as output 32, while inactivating outputs 34 and 36. As the amplitude increases beyond a predetermined limit, comparator 30 activates a second output, such as output 34, in addition to output 32. As the envelope amplitude from video detector 20 continues to increase beyond a second predetermined limit and to its maximum value, comparator 30 activates a third output, such as output 36. Thus, as a function of time and an associated range in the envelope amplitude from video detector 20, comparator 30 selects between one and three outputs.

Outputs 32, 34, and 36 convey discrete signals to switch drivers 70. In a preferred embodiment, switch drivers 70 function to select one of three supply voltages which are input to envelope tracking circuit to 80. Therefore, switch drivers 70 can include control devices, such as transistor switches 75, which control switches in envelope tracking circuit 80 which allow electrical currents to flow from supply voltages 140, 150, and 160 to power amplifiers 90, 100, and 110.

Desirably, envelope tracking circuit 80 includes at least one device such as an operational amplifier with a bandwidth which is commensurate with the bandwidth of the radio frequency signal envelope at the output of video detector 20. The use of an operational amplifier, or other suitable device allows the adjustment in the voltages coupled to power amplifiers 90, 100, and 110. Thus, through the action of switch drivers 70 and envelope tracking circuit 80, electrical currents from supply voltages 140, 150, and 160 are tracked in accordance with the envelope amplitude of radio frequency signal sample 15. The resulting potential is coupled to power amplifiers 90, 100, and 110 allowing the near-saturation operating state of each power amplifier.

It is contemplated that supply voltages 140, 150, and 160 represent distinct voltage levels. In an example which is not intended to limit the present invention, supply voltage 140 may provide electrical current at a four-volt potential. Meanwhile, and also for exemplary purposes, supply voltages 150 and 160 may provide electrical current at a six and seven-volt potential, respectively. Thus, for low levels of the envelope amplitude from video detector 20, comparator 30 activates output 32 which selects supply voltage 140 to be the source of the potential coupled to output 82 of envelope tracking circuit 80. This selection results in an electrical current, with a potential which varies as a function of time in accordance with the envelope amplitude from video detector 20 up to the four-volt value of supply voltage 140, to be coupled to power amplifiers 90, 100, and 110. For this low-level signal, power amplifiers 100 and 110 remain in an inactive state.

As the level of the envelope amplitude from video detector 20 increases, comparator 30 activates output 34 which selects supply voltage 150 to be coupled to output 82 of envelope tracking circuit 80. This results in an electrical current, with a potential which varies as a function of time up to the six-volt value of supply voltage 150, to be coupled to power amplifier 90, 100, and 110. For this mid-level signal, power amplifier 110 remains in an inactive state.

As the level of the envelope amplitude from video detector 20 increases and approaches its peak value, comparator 30 activates output 36 which selects supply voltage 160 to be coupled to output 82 of envelope tracking circuit 80. This results in an electrical current, with a potential which varies as a function of time up to the seven-volt value of supply voltage 160, to be coupled to power amplifier 90, 100, and 110. For this high-level signal, all power amplifiers, 90, 100, and 110, are activated.

In the example of the preceding paragraphs, it has been assumed that power amplifiers 100 and 110 are inactive for some portion of the envelope amplitude from video detector 20. In the example, power amplifier 110 remains active only during high level portions of the envelope amplitude from video detector 20. Additionally, power amplifier 100 remains active only during mid and high level portions of the envelope amplitude. However, in alternate embodiments of the invention which make use of other types of transistors or, perhaps, tube type power amplifiers, it may not necessarily be advantageous for power amplifiers to be placed in an inactive state during portions of the envelope amplitude.

It can be appreciated that the selection of supply voltages 140, 150, and 160 in accordance with the instantaneous level of the envelope amplitude from video detector 20 allows power amplifiers 90, 100, and 110 to operate near a saturation level. As is well known in the art, operation of a power amplifier at or near the saturation level allows the amplifier to operate at its highest efficiency. Through proper selection of gate bias voltages, power amplifiers 90, 100, and 110, can be biased to achieve maximum performance at or near the values for supply voltages 140, 150, and 160.

As previously mentioned, the envelope amplitude from video detector 20 is conveyed to an input of envelope tracking circuit 80. Through coupling of the actual envelope amplitude of radio frequency signal sample 15 and the switching of the potentials generated by supply voltages 140, 150, and 160, output 82 of the envelope tracking circuit 80 can be advantageously adjusted to maintain high efficiency. This adjustment in voltage enables power amplifiers 90, 100, and 110 to operate in saturation prior to reaching the upper limit of the supply voltage.

For exemplary purposes which are not intended to limit the present invention, at low levels of the envelope amplitude from video detector 20 envelope tracking circuit 80 can couple a correspondingly low voltage to power amplifier 90, 100, and 110. This allows power amplifier 90 to operate at or near its saturation limit from very low levels of the envelope amplitude up to a value substantially near the four-volt limit of supply voltage 140. Similarly, as the level of the envelope amplitude from video detector 20 increases to an amount sufficient for comparator 30 to select supply voltage 150, envelope tracking circuit 80 can couple a corresponding voltage level to power amplifier 90, 100, and 110, thereby allowing power amplifiers 90 and 100 to operate at or near saturation up to the six-volt limit of supply voltage 150.

Finally, as the level of the envelope amplitude from video detector 20 increases and approaches a peak value, envelope tracking circuit 80 can couple a corresponding voltage level to power amplifier 90, 100, and 110, thereby allowing power amplifier 90, 100, and 110 to operate at or near saturation up to the seven-volt limit of supply voltage 160. Thus, through this process of allowing the supply voltages to track the envelope amplitude from video detector 20, power amplifiers 90, 100, and 110 are operated at or near saturation for a large portion of the envelope amplitude of radio frequency signal sample 15.

As previously mentioned, is the coupling of video detector 20 to envelope tracking and gate biasing circuit 40. Envelope tracking and gate biasing circuit 40 provides a means of adjusting the gate bias applied to each of power amplifiers 90, 100, and 110. This variable gate biasing allows power amplifiers 90, 100, and 110 to maintain stable gain performance as the drain voltage applied to each is adjusted in order to continuously operate at or near the saturation level for each. Thus, as output 82 of envelope tracking circuit 80 is increased and decreased in order to maintain the efficiency of power amplifiers 90, 100, and 110, the gate bias applied to each is preferably altered. For example, as output 82 of envelope tracking circuit 80 is adjusted downward, output 42 of envelope tracking and gate biasing circuit 40 is adjusted upward. This upward adjustment allows the transconductance ($g_m$) value of the power amplifier to remain constant, resulting in stable gain performance of the power amplifier during fluctuations in the drain voltage. In a similar manner, outputs 44 and 46 of envelope tracking and gate biasing circuit 40 provide similar upward and downward adjustment of the gate bias on power amplifier 100 and 110, respectively, in response to changes in the drain voltages of these power amplifiers.

In the event that other types of power amplifiers are used as power amplifiers 90, 100, and 110, envelope tracking and gate biasing circuit 40 can be designed to provide constant transconductance ($g_m$) in accordance with the specific characteristics of the chosen power amplifier type. Thus, in the event that the chosen power amplifier type exhibits transconductance which increases as drain voltage decreases, envelope tracking and gate biasing circuit 40 can be designed to decrease gate bias as drain voltage decreases, thus providing constant transconductance.

An output of each of power amplifiers 90, 100, and 110 is coupled to power combiner and matching unit 120. Power combiner and matching unit 120 serves to combine the power outputs of each of power amplifiers 90, 100, and 110 into a single output for coupling to radio frequency load 130. Power combiner and matching unit 120 also functions to match the output impedance of each of power amplifiers 90, 100, and 110 to a standard impedance, such as 50 or 75 Ohms.

Although FIG. 1 has been discussed using a three stage envelope tracking circuit and three power amplifier elements, nothing prevents the use of a larger number of envelope tracking stages and power amplifier elements. Thus, the invention can be practiced using M envelope tracking stages and N power amplifier elements such as is described with reference to FIG. 2.

Figure 2:
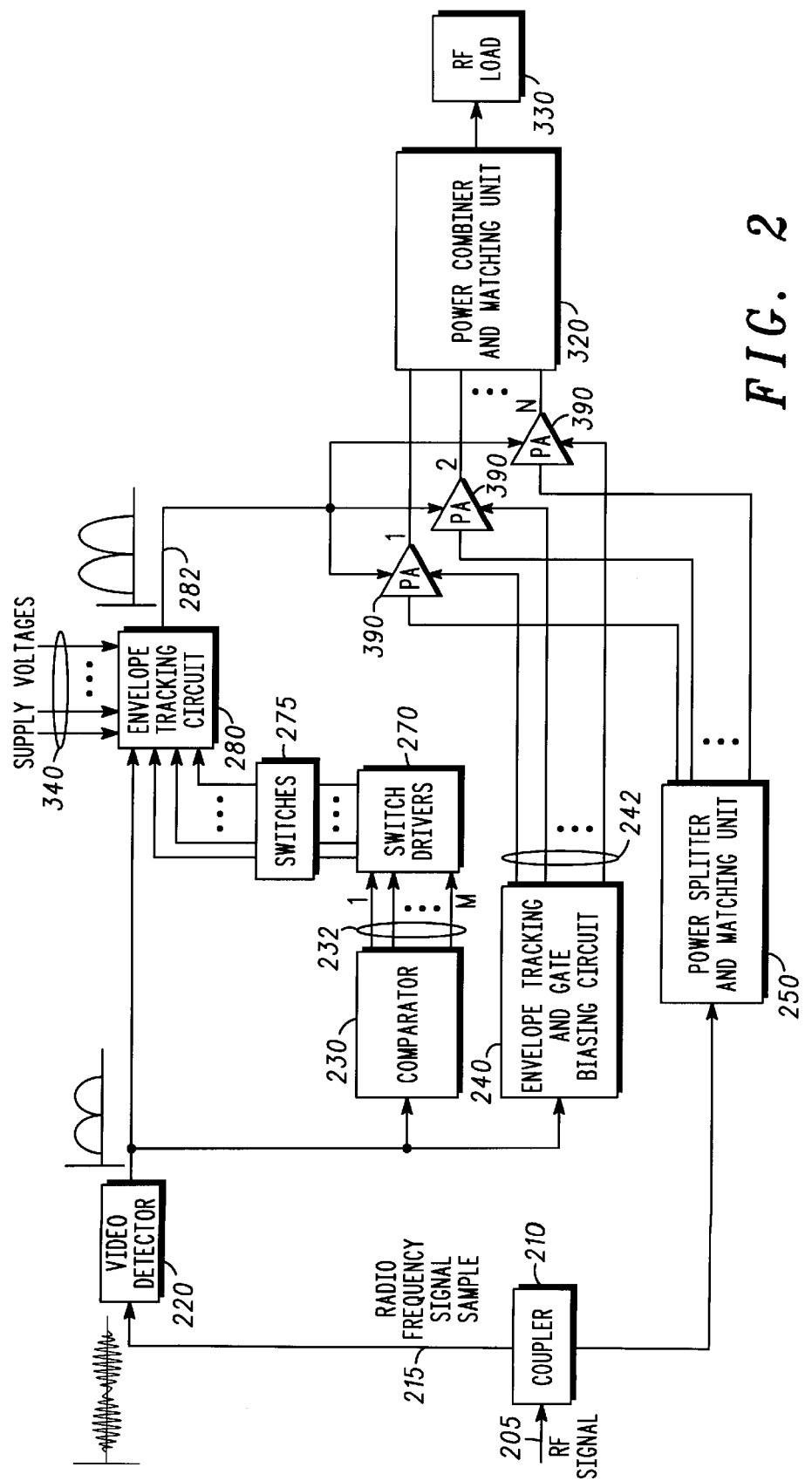
FIG. 2 is a block diagram of an M stage envelope tracking circuit supplying voltage to an N transistor high efficiency power amplifier circuit with wide dynamic backoff range in accordance with a preferred embodiment of the invention.

FIG. 2 is a block diagram of an M stage envelope tracking circuit supplying voltage to an N transistor high efficiency power amplifier circuit with wide dynamic backoff range in accordance with a preferred embodiment of the invention. Although there is no limitation on the number M of envelope tracking stages, it is anticipated that M will equal between two and six, although a greater number may be employed. In FIG. 2, radio frequency signal 205 is incident on coupler 210. Radio frequency signal 205 may include one or more communication signals intended for a corresponding number of subscribers in a manner which is comparable to radio frequency signal 5 of FIG. 1.

Preferably, coupler 210 presents a matched load to radio frequency signal 205, similar to coupler 10 of FIG. 1. Desirably, couple 210 minimizes the energy reflected back to the source of radio frequency signal 205. Thus, coupler 210 can include lumped or distributed circuit elements which provide appropriate matching. Additionally, coupler 210 conveys radio frequency signal sample 215 to video detector 220. Thus, radio frequency signal sample 215 is a reduced-power version of radio frequency signal 20 which includes only a small portion of the energy present in radio frequency signal 205.

Coupler 210 conveys the bulk of the energy included in radio frequency signal 205 to power splitter and matching unit 250. In a preferred embodiment, power splitter and matching unit 250 incorporates suitable lumped or distributed elements which match the signal from coupler 210 to the combination of the input impedances presented by the combination of N number of power amplifiers 390. Additionally, power splitter and matching unit 250 apportions the signal from coupler 210 in order to allow substantially equal coupling of radio frequency signal energy to each of power amplifiers 390.

Video detector 220 receives radio frequency signal sample 215 and determines the envelope amplitude of the signal. Video detector 220 includes a diode and other passive linear and/or nonlinear components similar to video detector 20 of FIG. 1. The envelope amplitude of radio frequency signal sample 215 from video detector 220 is conveyed to comparator 230, envelope tracking and gate biasing circuit 240, and to envelope tracking circuit 280.

As previously mentioned in reference to FIG. 2, comparator 230 accepts an envelope amplitude from video detector 220. In a preferred embodiment, comparator 230 operates similar to comparator 30 of FIG. 1. However, comparator 230 embodies M number of outputs 232. Thus, comparator 230 is capable of activating each of outputs 232 in response to the envelope amplitude from video detector 220. Thus, as a function of time and an associated amplitude range in the envelope amplitude from video detector 220, comparator 230 selects between 1 and M number of outputs 232.

Each of outputs 232 is conveyed to switch drivers 275, similar to the functions of switch drivers 70 of FIG. 1. Switch drivers 270 select one of N supply voltages 340 which are input to envelope tracking circuit 280. Therefore, through the action of switch drivers 275, electrical currents from supply voltages 340 are coupled to each of N power amplifiers 390.

It is contemplated that each of supply voltages 340 represent distinct voltage levels. Thus, similar to the operation of supply voltages 140, 150, and 160 of FIG. 1, each of supply voltages 340 is coupled to the drains of each of amplifiers 390 through output 282 of envelope tracking circuit 280. By way of operating each of power amplifiers 390 near a saturation level in response to an envelope amplitude, the efficiency of each of power amplifiers 390 can be maintained at a high level. Through proper selection of bias voltages for each of power amplifiers 390, each can be biased to achieve maximum performance at or near the values for a particular one of supply voltages 340.

As previously mentioned, video detector 220 is coupled to envelope tracking and gate biasing circuit 240. Envelope tracking and gate biasing circuit 240 provides a means of adjusting the gate bias applied to each of power amplifiers 390. This variable gate biasing allows power amplifiers 390 to maintain stable gain performance as the drain voltage applied to each is varied. Envelope tracking and gate biasing circuit 240 operates similar to envelope tracking and gate biasing circuit 40 of FIG. 1 except that envelope tracking and gate biasing circuit 240 incorporates N number of outputs.

An output of each of power amplifiers 390 is coupled to power combiner and matching unit 320. Power combiner and matching unit 320 serves to combine the power outputs of each of power amplifiers 390 into a single output for coupling to radio frequency load 330. Power combiner and matching unit 320 also functions to match the output impedance of each of power amplifiers 390 to a standard impedance, such as 50 or 75 Ohms.

Figure 3:
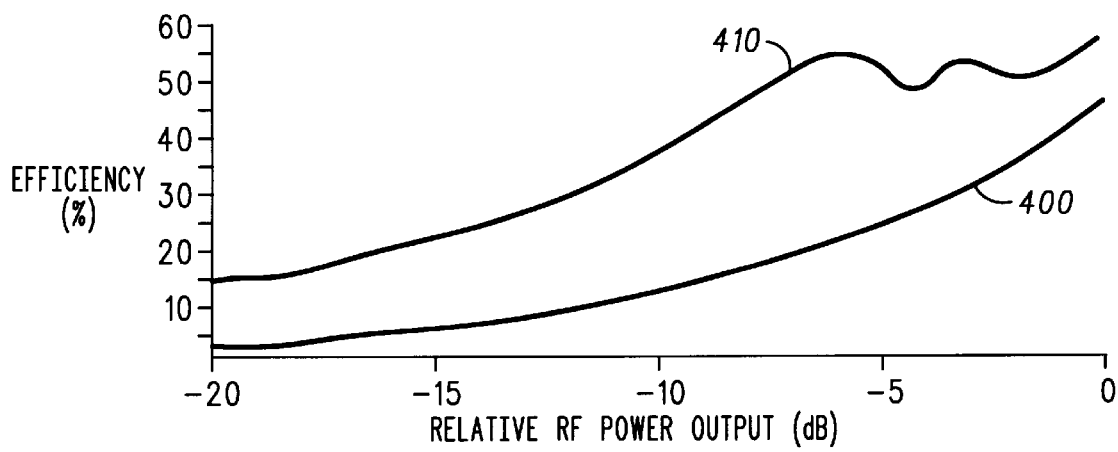
FIG. 3 is a graphical representation of the predicted efficiency versus relative radio frequency power output for the high efficiency power amplifier circuit with wide dynamic backoff range of FIG. 1 in accordance with a preferred embodiment of the invention.

FIG. 3 is a graphical representation of the predicted efficiency versus relative radio frequency power output for the three-transistor high efficiency power amplifier circuit with wide dynamic backoff range of FIG. 1 in accordance with a preferred embodiment of the invention. In FIG. 3, curve 410 represents the predicted efficiency of the amplifier circuit of FIG. 1 operated when using QPSK (quadrature phase shift keying) modulation. Curve 400 of FIG. 3 illustrates the predicted efficiency when power amplifiers 90, 100, and 110 of FIG. 1 are biased for Class B operation using the same modulation technique. The vertical axis of FIG. 3 represents a measure of the efficiency of the two amplifier circuits, with 60 percent maximum being typical for depletion mode field effect transistors available today. The horizontal axis FIG. 3 represents a measure of relative radio frequency output power, with 0 dBm being the maximum power output.

The significance of FIG. 3 lies in the area between curves 400 and 410. It can be appreciated that a power amplifier circuit constructed in accordance with the principles of the present invention results in a substantial improvement in efficiency while the amplifier is operated at less than its maximum power output level. For example, when the power output of the amplifier circuit is operated 10 dB into the backoff range (i.e. 10 dB below the maximum power output) the efficiency of the amplifier circuit can be expected to be near 40 percent. This level of efficiency is in contrast to the Class B curve of FIG. 3 which predicts efficiency of slightly less than 15 percent.

Figure 4:
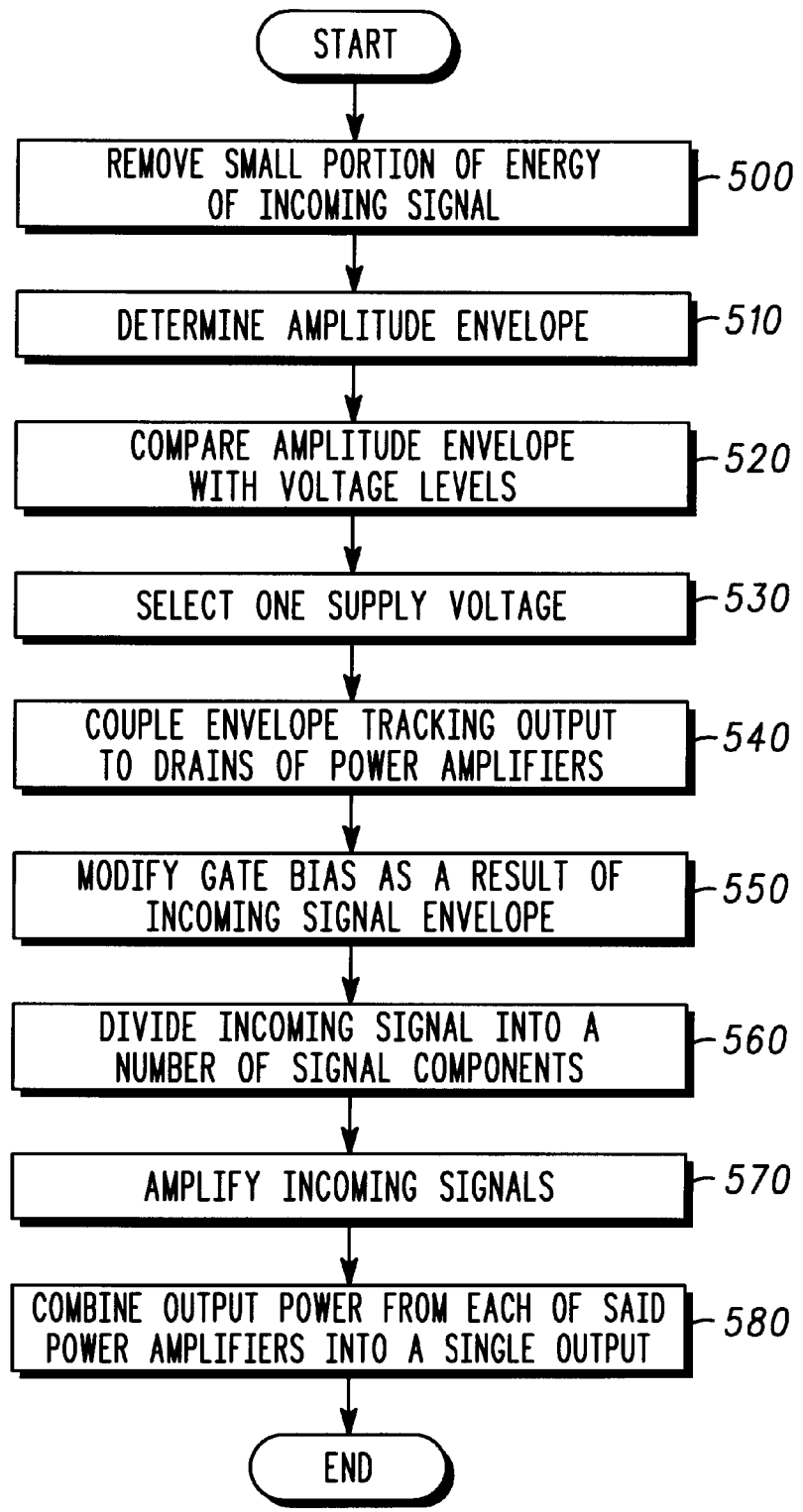
FIG. 4 is a flow chart of a method executed by the apparatus of FIG. 1 or 2 for providing high efficiency power amplification with wide dynamic backoff range in accordance with a preferred embodiment of the invention.

FIG. 4 is a flow chart of a method executed by the apparatus of FIG. 1 or 2 for providing high efficiency power amplification with wide dynamic backoff range in accordance with a preferred embodiment of the invention. The method of FIG. 4 begins with step 500 where a small portion of energy from an incoming radio frequency signal is removed in order to create a sample of the incoming radio frequency signal. At step 510, the envelope amplitude of the incoming radio frequency signal sample is determined. At step 520, the envelope amplitude is compared with a predetermined voltage level. At step 530, one supply voltage is selected and adjusted in order to supply power to the amplifiers and allow each to operate near saturation.

In step 540 one of a plurality of supply voltages is adjusted and subsequently coupled to the power amplifier drains via the envelope tracking circuits. In step 550, the gate bias of at least one power amplifier is modified as a result of the envelope amplitude of the incoming radio frequency signal. In step 560, the incoming radio frequency signal is divided into a number of signal components. In step 570, the incoming signals are amplified using at least one power amplifier. In step 580, the output power from each of the power amplifiers is combined into a single output. The method terminates after the execution of step 580.

Figure 5:
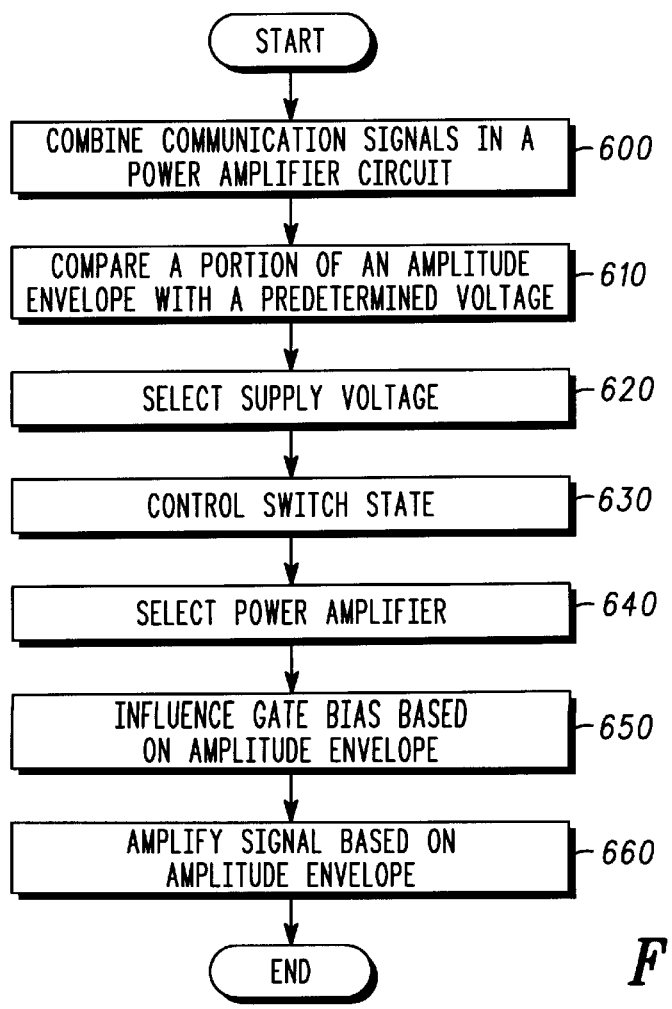
FIG. 5 is a flow chart of another method executed by the apparatus of FIGS. 1 or 2 for providing high efficiency power amplification with wide dynamic backoff range in accordance with a preferred embodiment of the invention.

FIG. 5 is a flow chart of another method executed by the apparatus of FIG. 1 or 2 for providing high efficiency power amplification with wide dynamic backoff range in accordance with a preferred embodiment of the invention. The method of FIG. 5 begins at step 600 where a plurality of communications signals are combined in a power amplifier circuit to form a composite radio frequency signal. In step 610, a portion of an envelope amplitude is compared with a predetermined voltage. In step 620, a supply voltage is selected and adjusted in accordance with a portion of the envelope amplitude compared in step 610.

In step 630, a state of a control switch is modified in response to the supply voltage selection of step 620. In a preferred embodiment, the switches of step 630 are switched to an ON state which allows a current at a potential determined by the envelope of the composite radio frequency signal to flow through the switch. The selection of step 630 allows step 640 to be executed in which a power amplifier is selected by way of a current flowing from the switch of step 630 into the power amplifier of step 640. In step 650 the gate bias of at least one power amplifier is influenced in response to the envelope amplitude of the incoming radio frequency signal. In step 660, one or more power amplifiers amplify the incoming radio frequency signal to produce an amplified composite signal. Step 660 is performed using the power amplifiers selected in step 640. The method then terminates after step 660.

The high efficiency power amplifier circuit with wide dynamic backoff range as described herein allows a satellite or terrestrial-based communications node to provide efficient power amplification over a variety of output power levels. This allows a satellite and terrestrial-based communications node to be built using smaller primary power sources without sacrificing usable radio frequency output power. Additionally, as a larger percentage of usable power can be transmitted through a communications antenna, the associated communications system can function properly using smaller and less-complex cooling provisions. This can reduce the cost of wireless satellite or terrestrial-based communications, making these services more affordable to subscribers.

Accordingly, it is intended by the appended claims to cover all of the modifications that fall within the true spirit and scope of the invention.

What is claimed is:

1. A power amplifier circuit comprising:
   a plurality of switches, wherein a first end of each of said plurality of switches is coupled to a corresponding one of a plurality of supply voltages;
   a plurality of power amplifiers, wherein a drain of each of said plurality of power amplifiers is coupled to at least one of said plurality of supply voltages through a second end of said corresponding one of said plurality of switches; and
   a comparator which responds to an amplitude of a radio frequency signal envelope, said comparator being coupled to said second end of each of said plurality of switches and influencing a mode of each of said plurality of switches, thereby influencing an operating state of each of said plurality of power amplifiers.

2. The power amplifier circuit of claim 1, additionally comprising a video detector for determining said amplitude of said radio frequency signal envelope as a function of time and conveying said amplitude to said plurality of switches for tracking said radio frequency signal envelope.

3. The power amplifier circuit of claim 2, additionally comprising an envelope tracking and gate biasing circuit coupled to at least one of said plurality of power amplifiers for modifying a gate bias as a result of said radio frequency signal envelope.

4. The power amplifier circuit of claim 2, additionally comprising a coupler for removing a sample of a radio frequency signal and conveying said sample to said video detector.

5. The power amplifier circuit of claim 1, additionally comprising a power splitter and matching unit for dividing a radio frequency signal into a number of signal components and conveying said signal components to each of said plurality of power amplifiers.

6. The power amplifier circuit of claim 5, wherein said power splitter and matching unit additionally matches an input impedance of at least one of said plurality of power amplifiers to a standard impedance value.

7. The power amplifier circuit of claim 1, additionally comprising a power combining and matching unit for combining output power from each of said plurality of power amplifiers.

8. The power amplifier circuit of claim 7, wherein said power combining and matching unit additionally matches an output impedance of at least one of said plurality of power amplifiers to a standard impedance value.

9. A method of amplifying a composite signal in a power amplifier circuit, comprising the steps of:
   determining an envelope amplitude of a radio frequency signal;
   comparing said envelope amplitude with a plurality of voltage levels;
   selecting one of a plurality of supply voltages based on said comparing step;
   coupling said one of said plurality of supply voltages to a plurality of power amplifiers based on selecting step; and
   amplifying said radio frequency signal using at least one of said plurality of power amplifiers.

10. The method of claim 9, wherein said selecting step further comprises the step of coupling one of a plurality of supply voltages to a drain
   of at least one of said plurality of power amplifiers.

11. The method of claim 9, wherein said determining step further comprises the step of removing a small portion of energy of said radio frequency signal in order to determine said envelope amplitude.

12. The method of claim 9, wherein said amplifying step further comprises the step of modifying a gate bias as a result of said envelope amplitude.

13. The method of claim 12, wherein said modifying step further comprises the step of increasing said gate bias when an instantaneous level of said envelope amplitude decreases.

14. The method of claim 9, wherein said amplifying step further comprises the step of dividing said radio frequency signal into a number of signal components and conveying said signal components to each of said plurality of power amplifiers.

15. The method of claim 9, wherein said amplifying step further comprises the step of combining output power from each of said plurality of power amplifiers into a single output.

16. In a communications node, a method for producing an amplified composite signal, comprising the steps of:
   combining a plurality of communications signals in a power amplifier circuit to form a composite radio frequency signal;
   selecting a supply voltage based on an envelope amplitude of said composite radio frequency signal;
   selecting a power amplifier based on an envelope amplitude of said composite radio frequency signal; and
   amplifying said composite radio frequency signal based on a portion of said envelope amplitude of said composite radio frequency signal to form said amplified composite signal.

17. The method of claim 16, wherein said power amplifier is a transistor amplifier and said selecting step further comprises influencing a gate bias on said transistor amplifier based on said envelope amplitude of said composite radio frequency signal.

18. The method of claim 16, wherein said selecting step further comprises the step of selecting a supply voltage which is coupled to said power amplifier.

19. The method of claim 18, wherein said selecting step further comprises the step of comparing said portion of said envelope amplitude with a predetermined voltage and selecting a power amplifier based on said selecting step.

20. The method of claim 19, wherein said selecting step further comprises the step of controlling a state of a switch which conveys said supply voltage to said power amplifier.

* * * * *